United States Patent
Park et al.

(10) Patent No.: US 11,144,046 B2
(45) Date of Patent: Oct. 12, 2021

(54) FAULT SIGNAL RECOVERY APPARATUS AND METHOD

(71) Applicant: DOOSAN HEAVY INDUSTRIES & CONSTRUCTION CO., LTD, Changwon-si (KR)

(72) Inventors: Jee Hun Park, Gwangmyeong-si (KR); Hyun Sik Kim, Gimpo-si (KR)

(73) Assignee: DOOSAN HEAVY INDUSTRIES & CONSTRUCTION CO., LTD., Gyeongsangnam-do (KR)

( * ) Notice: Subject to any disclaimer, the term of this patent is extended or adjusted under 35 U.S.C. 154(b) by 672 days.

(21) Appl. No.: 15/813,946

(22) Filed: Nov. 15, 2017

(65) Prior Publication Data
US 2018/0136641 A1    May 17, 2018

(30) Foreign Application Priority Data
Nov. 17, 2016   (KR) .................. 10-2016-0153362

(51) Int. Cl.
*G05B 23/02* (2006.01)
*G06N 20/00* (2019.01)
(Continued)

(52) U.S. Cl.
CPC ..... *G05B 23/0289* (2013.01); *G05B 23/0221* (2013.01); *G05B 23/0286* (2013.01);
(Continued)

(58) Field of Classification Search
CPC ............ G05B 23/0205; G05B 23/0221; G05B 23/0259; G05B 23/0286; G05B 23/0289; G06N 20/20; G06F 30/17
See application file for complete search history.

(56) References Cited

U.S. PATENT DOCUMENTS 4,604,701 A *  8/1986  Fujawa .............. F02B 37/24
                                          701/99
7,313,550 B2 * 12/2007  Kulkarni ............. G06N 3/086
                                          706/21
(Continued)

FOREIGN PATENT DOCUMENTS

JP      2002341901 A    11/2002
WO      2016/039805 A1   3/2016

OTHER PUBLICATIONS

Batista et al., A Study of K-Nearest Neighbour as an Imputation Method, 2002, In: Abraham A et al (eds) Hybrid Intell Syst, Ser Front Artif Intell Appl 87, IOS Press, pp. 251-260 (Year: 2002).*
(Continued)

*Primary Examiner* — Catherine T. Rastovski
*Assistant Examiner* — Liam R Casey
(74) *Attorney, Agent, or Firm* — Invenstone Patent, LLC

(57) ABSTRACT

A fault signal recovery apparatus and method for collecting signals obtained in a plant and recovering normal signals from fault signals contained in the measured signals through a machine learning method includes receiving an input X including only normal signals for a plurality of tags, an input U including fault signals for a first group of tags among the plurality of tags and normal signals for a second group of tags, and an input S having information on the first group of tags including fault signals, and estimating and recovering normal signals for the first group of tags including fault signals based on feature information F, recovery model information P, and ensemble learning.

10 Claims, 7 Drawing Sheets

(51) Int. Cl.
*G06N 20/20* (2019.01)
*G06F 30/17* (2020.01)

(52) U.S. Cl.
CPC ............ *G06F 30/17* (2020.01); *G06N 20/00* (2019.01); *G06N 20/20* (2019.01)

(56) References Cited

U.S. PATENT DOCUMENTS

| | | | |
|---|---|---|---|
| 2004/0172227 A1* | 9/2004 | Aragones | G05B 17/02 703/8 |
| 2010/0183555 A1* | 7/2010 | Vidaud | G01N 33/5767 424/85.7 |
| 2012/0133497 A1* | 5/2012 | Sasaki | G06K 9/00805 340/425.5 |
| 2012/0326883 A1* | 12/2012 | Angelis | H04Q 9/00 340/870.02 |
| 2013/0024179 A1* | 1/2013 | Mazzaro | F01K 13/02 703/18 |
| 2013/0073170 A1* | 3/2013 | Drohan | G05B 17/02 701/100 |
| 2015/0371151 A1 | 12/2015 | Georgescu et al. | |
| 2016/0327397 A1* | 11/2016 | Cordova | G06Q 40/08 |
| 2016/0365736 A1* | 12/2016 | Block | G05B 13/042 |
| 2016/0377309 A1* | 12/2016 | Abiprojo | G06Q 10/06 700/276 |
| 2017/0193381 A1* | 7/2017 | Subramaniyan | G06N 7/005 |
| 2017/0233094 A1* | 8/2017 | Lin | H04L 67/12 701/29.1 |
| 2017/0371329 A1* | 12/2017 | Giering | G06T 7/248 |
| 2019/0141418 A1* | 5/2019 | Harma | G16H 15/00 |
| 2019/0264573 A1* | 8/2019 | Nagano | F02C 7/00 |

OTHER PUBLICATIONS

Kotsiantis et al. "Bagged Averaging of Regression Models," Artificial Intelligence Applications and Innovations, 2006, pp. 53-60 (Year: 2006).*

English Translation of the Korean Office Action dated Oct. 29, 2018 in connection with Korean Patent Application No. 10-2016-0153362 which corresponds to the above-referenced U.S. application.

* cited by examiner

FAULT SIGNAL RECOVERY APPARATUS AND METHOD

CROSS-REFERENCE TO RELATED APPLICATION

This application claims priority to Korean Patent Application No. 10-2016-0153362, filed on Nov. 17, 2016 the disclosure of which is incorporated herein by reference in its entirety.

BACKGROUND

Exemplary embodiments of the present disclosure relate to an apparatus and method for collecting signals obtained by measuring a plant and recovering a fault signal among the measured signals, and more particularly, to a fault signal recovery apparatus and method for recovering a normal signal from a fault signal using a machine learning method.

In general, large-sized plants such as a power generation plant and chemical plant include various types of machines and electrical installations which are complexly connected and operated. Such plants must monitor an abnormality which may cause an accident in order to stably supply power with reliability. Thus, each of the plants uses a monitoring device which monitors in real time whether components of the plant are damaged, and issues an alarm to an operator when an abnormality is discovered.

Since a fault in the plant damages the plant, the plant may exhibit an undesired performance when a fault occurs. Furthermore, when the plant is destroyed, an operator may become injured or may even result in death, and environmental problems may also occur. Therefore, the plant necessarily requires an early warning system capable of sensing a fault in early stages.

The early warning system which warns of a fault or fault probability receives real-time monitored signals from the plant and stores the received signals. Based on the stored signals, the early warning system needs to identify a fault signal and inform an operator of the identification of the fault signal. Therefore, the most important part of the early warning system may be a fault prediction model capable of predicting a fault in early stages. The fault prediction model should be able to correctly predict a normal state of the plant. When a monitored signal different from the normal state is received, the fault prediction model may determine that a fault occurred.

The fault prediction model requires high-quality learning data in order to operate as correctly as possible. In other words, the fault prediction model should be able to learn about the normal state using high-quality learning data, thereby increasing the precision of the fault prediction model. Therefore, the top priority for the precision of the fault prediction model is to secure high-quality learning data. However, although most of monitored signals are appropriate for being used as learning data, faulty signals may be generated from some sensors due to a sensor fault or network problem as well as an actual fault of the plant. In general, data containing such faulty signals cannot be used as learning data. However, when other high-equality data are discarded due to some faulty signals, efficiency in terms of performance is reduced. In such a case, if the original normal signals can be recovered from the faulty signals, the whole data can be used as learning data.

Such a fault signal recovery technique is recognized as a technique that the early warning system must be equipped with. Furthermore, since signals recovered by the fault signal recovery technique can be used as learning data for constructing the fault prediction model, accurate recovery performance is required to construct a precise fault prediction model. However, since the existing fault signal recovery techniques have low precision, there is a demand for a technique for increasing the precision.

SUMMARY

The present disclosure addresses the above problems, and it is an object of the present disclosure to provide a fault signal recovery apparatus and method which exhibits excellent recovery performance, has generality to be applied to any targets, and is based on a machine learning algorithm in order to facilitate development and maintenance.

Other objects and advantages of the present disclosure can be understood by the following description, and become apparent with reference to the exemplary embodiments. Also, those skilled in the art to which the present disclosure pertains would recognize that the objects and advantages of the present disclosure can be realized by the means as claimed and combinations thereof.

In accordance with one aspect, there is provided a fault signal recovery apparatus for recovering normal signals for a plurality of tags including a first group of tags having fault signals and a second group of tags having normal signals. The fault signal recovery apparatus includes a data processing unit configured to generate a signal group U* by removing signals of the first group of tags from a signal group U composed of signals of the plurality of tags, a modeling unit configured to extract feature information F based on a signal group X composed of normal signals for the plurality of tags and create plural pieces of recovery model information P used for fault signal recovery, and a recovery unit configured to estimate and recover normal signals for the first group of tags based on the signal group U*, the signal group X, the feature information F, and the plural pieces of recovery model information P. The data processing unit may be configured to generate a signal group Xs composed of only the normal signals for the first group of tags and a signal group X* composed of only the normal signals for the second group of tags.

The modeling unit may include a first feature extraction unit configured to extract the feature information F from the signal group X*, and a model creation unit configured to create the plural pieces of recovery model information P used for fault signal recovery based on the feature information F, the signal group X* and the signal group Xs. The recovery unit may include a second feature extraction unit configured to extract feature information F* from the signal group U*, a recovery model selection unit configured to select recovery models to be used for fault signal recovery among a plurality of recovery models based on the feature information F, the plural pieces of recovery model information P, and the feature information F*, a k-NN (k-Nearest Neighbor) based recovery unit configured to generate a first recovery signal value for the first group of tags through a k-NN method using the selected recovery models, an MLRM (Multiple Linear Regression Model) based recovery unit configured to generate a second recovery signal value for the first group of tags through an MLRM method using the selected recovery models, and an ensemble learning unit configured to generate a final recovery signal value for the first group of tags through ensemble learning, based on the first and second recovery signal values.

The first and second feature extraction units may extract a feature using the same method. The k-NN based recovery unit may include a similarity estimation module configured to calculate similarities between the signal group Xs and estimation results of the selected recovery models, an optimization module configured to optimize a parameter k of the k-NN method, a weight module configured to calculate weights for the selected recovery models, and a recovery module configured to calculate a recovery value based on the parameter k, the weights and the estimation results of the selected recovery models. The MLRM based recovery unit may generate the second recovery signal value for the first group of tags by adding weighted estimation results, each of the weighted estimation results being a value obtained by multiplying an estimation result of a respective recovery model of the selected recovery models by a corresponding weight for the respective recovery model.

In accordance with another aspect, there is provided a fault signal recovery method for recovering normal signals for a plurality of tags including a first group of tags having fault signals and a second group of tags having normal signals. The fault signal recovery method includes a data processing step of generating a signal group U* by removing signals of the first group of tags from a signal group U composed of signals of the plurality of tags, a recovery model creation step of extracting feature information F from a signal group X composed of normal signals for the plurality of tags and creating plural pieces of recovery model information P used for fault signal recovery, and a recovery step of estimating and recovering normal signals for the first group of tags based on the signal group U*, the signal group X, the feature information F, and the plural pieces of recovery model information P. The data processing step may include generating a signal group Xs composed of only the normal signals for the first group of tags and a signal group X* composed of only the normal signals for the second group of tags.

The recovery model creation step may include a first feature extraction step of extracting the feature information F from the signal group X*, and a recovery model creation step of creating the plural pieces of recovery model information P used for fault signal recovery based on the feature information F, the signal group X*, and the signal group Xs. The recovery step may include a second feature extraction step of extracting feature information F* from the signal group U*, a recovery model selection step of selecting recovery models which are to be used for fault signal recovery among a plural pieces of recovery model information P based on a comparison result between the feature information F and the feature information F*, a k-NN method based recovery step of generating a first recovery value for the first group of tags based on a k-NN method using the selected recovery models, an MLRM method based recovery step of generating a second recovery value for the first group of tags based on an MLRM method using the selected recovery models, and a recovery value generation step of generating a recovery value for the first group of tags through ensemble learning based on the first and second recovery values. The first and second feature extraction steps may use the same method to extract a feature.

The k-NN method based recovery step may include a similarity estimation step of calculating similarities between the signal group Xs and estimation results of the selected recovery models; an optimization step of optimizing a parameter k of the k-NN method, a weight calculation step of calculating weights for the selected recovery models, and a recovery value calculation step of calculating a recovery value based on the parameter k, the weights, and the estimation results of the selected recovery models. The MLRM method based recovery step may include generating the second recovery signal value for the first group of tags by adding weighted estimation results, each of the weighted estimation results being a value obtained by multiplying an estimation result of a respective recovery model of the selected recovery models by a corresponding weight for the respective recovery model.

According to the exemplary embodiments, the fault signal recovery apparatus and method may be based on the machine learning algorithm, and generate high-quality learning data by recovering normal signals with high precision, thereby improving the accuracy of fault prediction.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
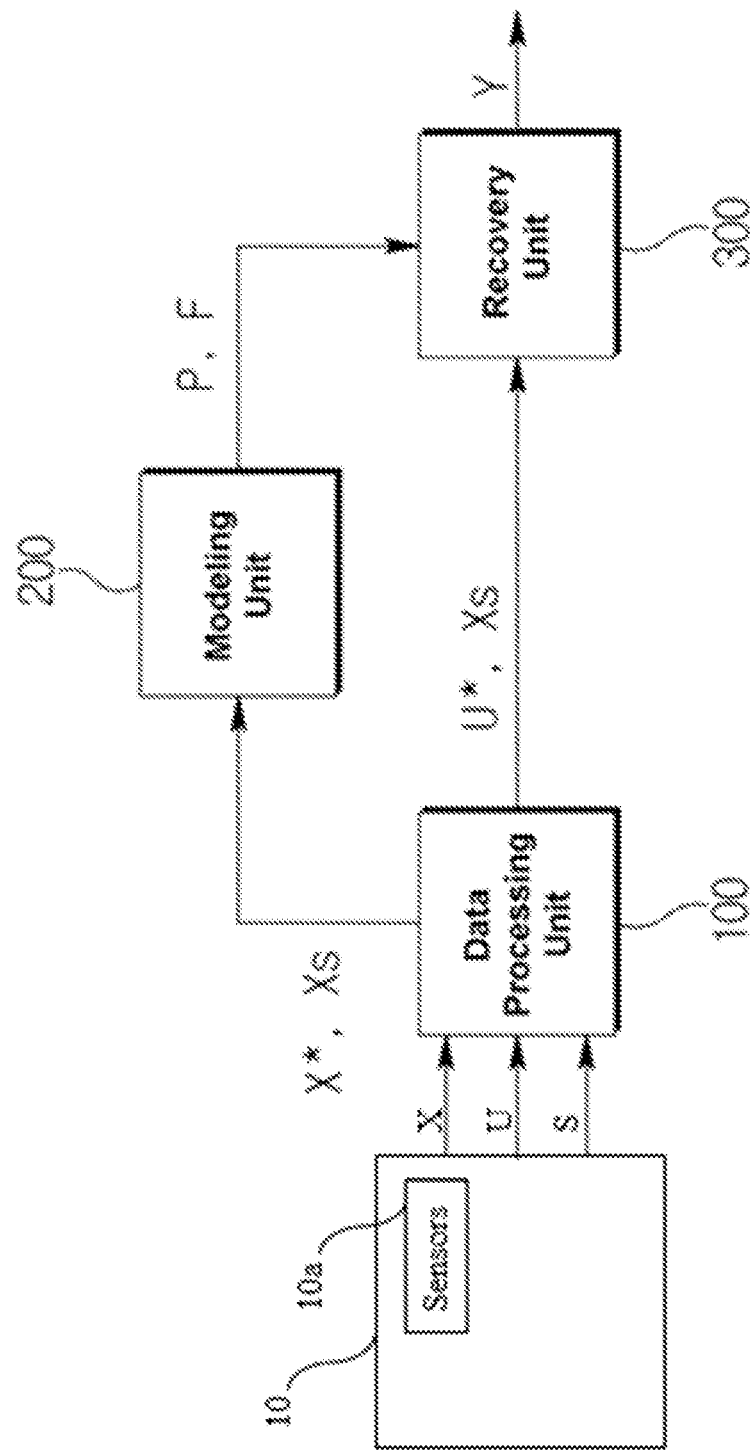
FIG. 1 is a block diagram of a fault signal recovery apparatus according to an exemplary embodiment.

In order to clearly describe the exemplary embodiments, components which are not related to the descriptions will be omitted. Throughout the specification, the same or similar components will be represented by like reference numerals.

Throughout the specification, when one element is referred to as being 'connected to' or 'coupled to' another element, it may not only indicate that the former element is directly connected or coupled to the latter element, but also indicate that the former element is electrically connected to the latter element with another element interposed therebetween. Furthermore, when an element "includes" a component, it may indicate that the element does not exclude another component, but can further include another component, unless referred to the contrary.

The terms such as first, second and third are used to describe various parts, components, regions, layers and/or sections, but not limited thereto. The terms are used only to distinguish a part, component, region, layer or section from another part, component, region, layer or section. Therefore, in the following descriptions, a first part, component, region, layer or section may be referred to as a second part, component, region, layer or section without departing from the sprit and scope of the present disclosure.

Technical terms used herein are used only to describe a specific embodiment, but not limit the present disclosure. The terms of a singular form used herein may include plural forms unless referred to the contrary. The meaning of the term "including" used in the specification specifies a characteristic, region, integer, step, operation, element and/or component, and not exclude a presence or addition of another characteristic, region, integer, step, operation, element and/or component.

The terms used herein, including technical or scientific terms, have the same meanings as the terms which are generally understood by those skilled in the art to which the present disclosure pertains, as long as they are differently defined. The terms defined in a generally used dictionary may be analyzed to have meanings which coincide with contextual meanings in the related art. As long as the terms are not clearly defined in this specification, the terms may not be analyzed as ideal or excessively formal meanings.

Hereafter, referring to the accompanying drawings, exemplary embodiments of the present disclosure will be described in detail such that they can easily be carried out by a person with ordinary skill in the art to which the present invention pertains. However, the present disclosure can be embodied in various forms, and are not limited to the embodiments.

For purposes of explanation only hereinafter, a tag may indicate a kind of signal which can be measured in a plant. For example, the tag may not only include a type of signal, such as a difference pressure of an inlet filter, a turbine exhaust pressure, a temperature, or other signals which can be directly acquired from the plant using a sensor, but may also include a value, such as output power which can be calculated based on a signal acquired using a sensor.

FIG. 1 is a block diagram of a fault signal recovery apparatus according to an exemplary embodiment.

Referring to FIG. 1, the fault signal recovery apparatus according to an exemplary embodiment may include a plant 10 such as a power generation plant, a data processing unit 100, a modeling unit 200, and a recovery unit 300. The data processing unit 100 is a module for processing data in advance in order to recover a fault signal. The data processing unit 100 may receive three groups of data X, U and S as an input from the plant 10 including sensors 10a. The signal group X indicates learning data used to create an existing fault prediction model, and includes normal signals. The signal group U may indicate newly measured data containing signals for a plurality of tags including a first group of tags having fault signals and a second group of tags having normal signals. That is, the first group of tags of the signal group U have fault signals which are to be recovered, and the data processing unit 100 may recover normal signals from the first group of tags such that the normal signals can be used as learning data. The input S may include information on the first group of tags.

Figure 2:
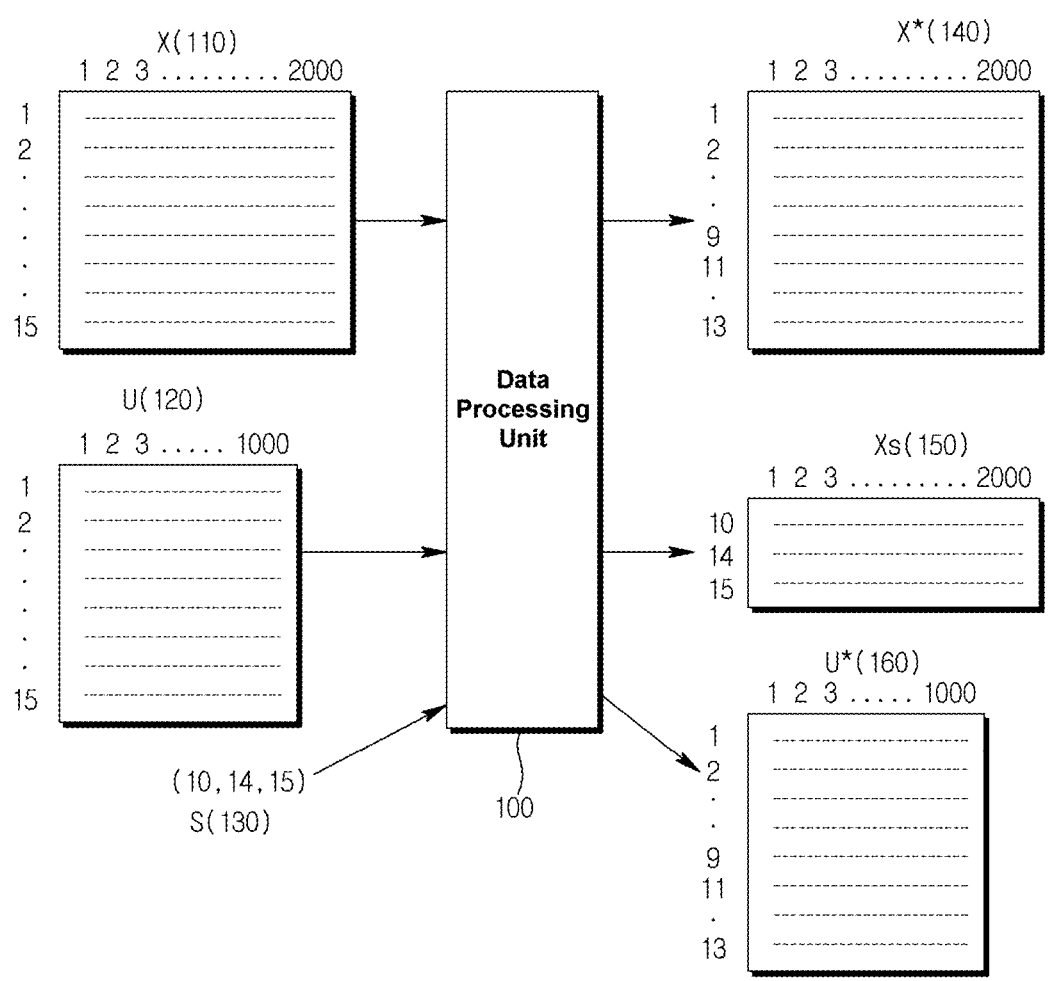
FIG. 2 illustrates an exemplary embodiment in which a data processing unit receives inputs X, U and S and generates outputs X*, Xs and U*.

FIG. 2 illustrates an exemplary embodiment in which the data processing unit 100 receives the signal groups X and U and the input S and generates signal groups X*, Xs and U*.

Referring to FIG. 2, input and output of the data processing unit 100 may be expressed in the form of a matrix. The signal group X 110 indicate learning data used to create an existing fault prediction model. The rows of the signal group X 110 may indicate the types of signals measured in a plant, that is, the types of tags, and the columns of the signal group X 110 may indicate the values of the respective tags in a time-ordered sequence. For example, signals may be acquired once every five minutes through sensors, and the values of the signals may be put into the columns of the respective tags. Then, the signal group X 110 of FIG. 2, which may be a 15×2000 matrix, includes values which are acquired 2,000 times (i.e., seven days in time) for each of the 15 signal types. The signal group X 110 is used to create the existing fault prediction model, and all values within the matrix are normal values.

The signal group U 120 includes newly measured data. In the example of FIG. 2, one signal value may be acquired for each of the 15 tags every five minutes for 3.5 days in order to generate the signal group U 120, and an estimation result of fault prediction based on the acquired signal group U 120 indicates that the 10th, 14th, and 15th tags have a problem. Such a problem may be caused when a fault occurs in the plant. However, the problem may be caused when a sensor is not operating properly or a fault occurs in a network for transmitting a measured signal. At this time, an operation of determining which tag has a problem is not related to the present disclosure, and the descriptions thereof are omitted herein. The following exemplary embodiments will be based on the supposition that a specific tag having a problem is known from the input S 130.

The signal group U 120 has normal signals for 12 tags among the 15 tags, but has fault signals for the other three tags. In such a case, the signal group U 120 must be discarded in the related art, which means that data collected for 3.5 days disappear. Thus, the efficiency of the process of creating and executing a fault prediction model may be degraded. Therefore, the fault signal recovery apparatus according to an exemplary embodiment can recover tags having normal signals from the tags having fault signals, such that the signal group U 120 can be used as learning data. Thus, the fault signal recovery apparatus can prevent the waste of the collected data, and improve the efficiency of the fault prediction model creation process. In short, the signal group U 120 may be considered as data containing fault signals or data containing tags which are to be recovered.

The input S 130 includes information on tags required for recovery. The example of FIG. 2 indicates that the 10th, 14th and 15th tags among the tags of the signal group U 120 have fault signals.

The data processing unit 100 receives the signal groups X 110 and U 120 and the input S 130, and generates signal groups X* 140, Xs 150, and U* 160. The signal group X* 140 includes only normal signals corresponding to the second group of tags in the signal group X 110, and the signal group U* 160 includes only normal signals corresponding to the second group of tags in the signal group U 120. That is, in the example of FIG. 2, a 12×2000 matrix excluding the 10th, 14th, and 15th rows corresponding to the first group of tags in the signal group X 110 becomes the signal X* 140, and a 12×1000 matrix excluding the 10th, 14th, and 15th rows corresponding to the first group of tags in the signal group U 120 becomes the signal group U* 160. The signal group Xs 150 includes only normal signals corresponding to the first group of tags in the signal group X 110. That is, in the example of FIG. 2, the signal group Xs 150 becomes a 3×2000 matrix which has the data of the 10th, 14th and 15th rows of the signal group X 110.

The signal groups X*, U* and Xs outputted from the data processing unit 100 may be inputted to the modeling unit 200 and the recovery unit 300, and then used therein. In the above-described exemplary embodiment, the signal group X is separated into the signal groups X* and Xs by the data processing unit 100. However, the signal group X may be separated into the signal groups X* and Xs by another unit of the fault signal recovery apparatus.

Figure 3:
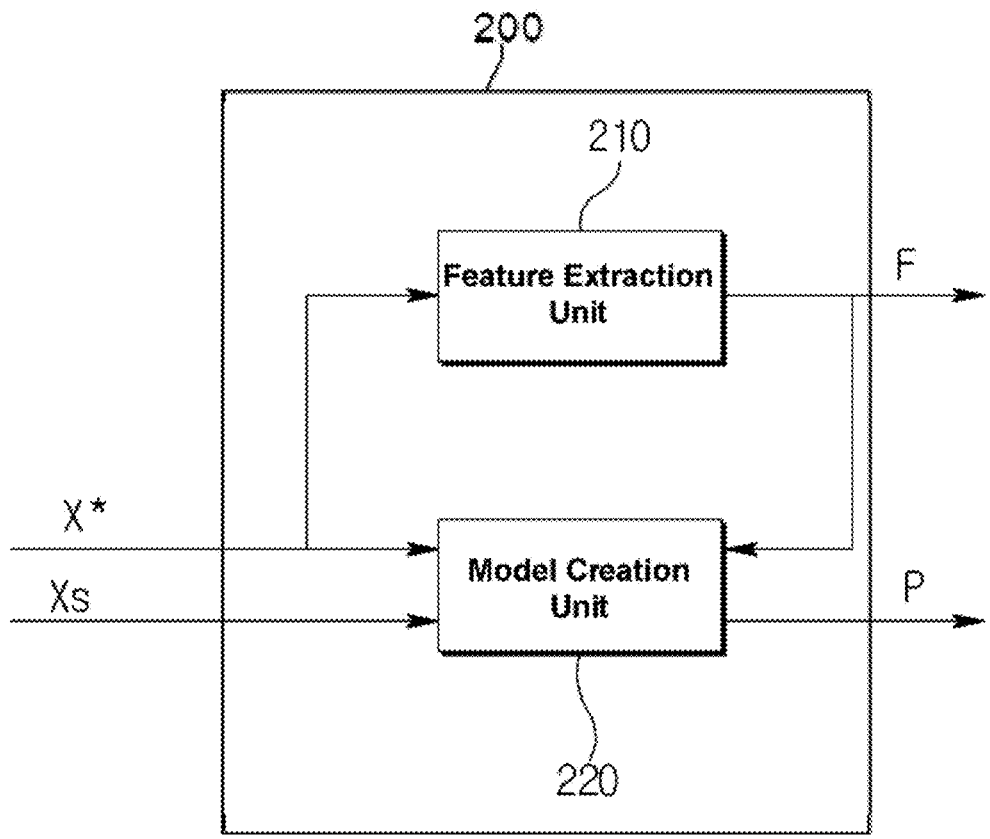
FIG. 3 is a block diagram of a modeling unit according to an exemplary embodiment.

FIG. 3 is a block diagram of the modeling unit 200 according to an exemplary embodiment. Referring to FIG. 3, the modeling unit 200 may perform a function of creating a model for recovering a fault signal of the first group of tags, and include a feature extraction unit 210 and a model creation unit 220. The modeling unit 200 receives the signal groups X* and Xs generated by the data processing unit 100, and outputs extracted feature information F and created recovery model information P.

The feature extraction unit 210 may extract a feature indicated by the data based on the signal group X*. At this time, the feature extraction unit 210 may extract the feature using only one specific tag data, or extract the feature by combining data on the whole tags contained in the signal group X*, or data on some tags contained in the signal group X*. The extracted feature may indicate whether a power generator is started up or operated in a normal state, for example. Furthermore, the extracted feature may indicate in which season data were collected (e.g., spring, summer, fall and winter) or indicate a specific weather, for example. In addition, the feature extraction unit 210 may extract various features which may be obtained from data generated by the plant.

The model creation unit 220 may create a plurality of models. The models may include non-parametric models or parametric models. That is, referring to FIG. 3, the model creation unit 220 may generate a plurality of non-parametric models and parametric models using the signal groups X* and Xs received from the data processing unit 100 based on the feature F extracted by the feature extraction unit 210.

The parametric model refers to a model that describes a system using a finite number of parameters. That is, the parametric model can describe the system using a limited number of parameters. The parametric model may include, for example, a first principles-based model, a transfer function model, a state space model, and the like. The first principles-based model uses variables defined by the first law of physics as parameters, the state space model uses state variables as parameters, and the transfer function model uses variables defining a transfer function between input and output as parameters. The transfer function model may include ARX (Auto Regressive eXogenous), NARX (Nonlinear Auto Regressive eXogenous), FIR (Finite Impulse Response), and ARMAX (Auto Regressive Moving Average with eXogenous) models.

The non-parametric model which can use an infinite number of parameters to express a plant may include, for example, a NPM (Non Parametric Model), TM (Tree Model), NNM (Neural Network Model), and the like. Although the non-parametric model can conceptually use an infinite number of parameters, the non-parametric model may actually use only a finite number of parameters to express a model.

The model creation unit 220 decides parameters for optimizing one or more parametric models, respectively, using the signal groups X* and Xs based on the features extracted by the feature extraction unit 210, and decides parameters for optimizing one or more non-parametric models, respectively. The decided parameters may be contained in the model information P. That is, the model information P may contain the optimized parametric models and/or non-parametric models, and parameter information which is to be used by each of the optimized parametric models and/or non-parametric models. The modeling unit 200 constructs a plurality of models based on the feature information in order to more precisely recover signals.

Figure 4:
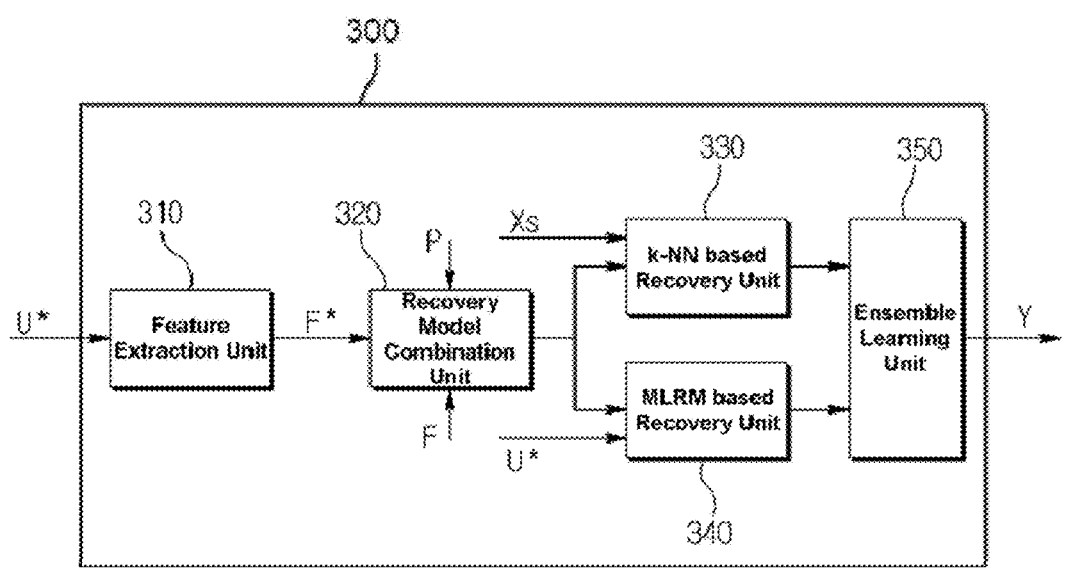
FIG. 4 is a block diagram of a recovery unit according to an exemplary embodiment.

FIG. 4 is a block diagram of a recovery unit 300 according to an exemplary embodiment. Referring to FIG. 4, the recovery unit 300 may include a feature extraction unit 310, a recovery model combination unit 320, a k-NN based recovery unit 330, an MLRM based recovery unit 340 and an ensemble learning unit 350.

The recovery unit 300 may use a k-NN (k-Nearest Neighbor) based recovery algorithm which is not a model-based recovery technique but an algorithm-based recovery technique, in order to maximize the expressive power of a model while minimizing an influence of data for a specific tag on data for another tag. Simultaneously, the recovery unit 300 may use an MLRM (Multiple Linear Regression Model) based recovery algorithm which is one of model-based recovery techniques in order to improve the generality while overcoming the disadvantage of the algorithm-based recovery technique.

The feature extraction unit 310 extracts a feature F* contained in the data of the signal group U*. The feature extraction unit 310 may extract a feature using the same method as those used in the feature extraction unit 210 of the modeling unit 200.

The recovery model combination unit 320 selects optimal recovery models, which are to be used for recovery, based on the model information P and feature information F generated by the modeling unit 200 and the feature information F* of the signal group U* extracted by the feature extraction unit 310. In particular, the recovery model combination unit 320 may select one or more parametric models and one or more non-parametric models. When selecting the optimal recovery models, the recovery model combination unit 320 may compare the feature information F extracted by the feature extraction unit 210 of the modeling unit 200 to the feature information F* extracted by the feature extraction unit 310 of the recovery unit 300 and find a similar region. Then, the recovery model combination unit 320 selects recovery models generating similar features in the similar region, as the optimal recovery models.

Figure 5:
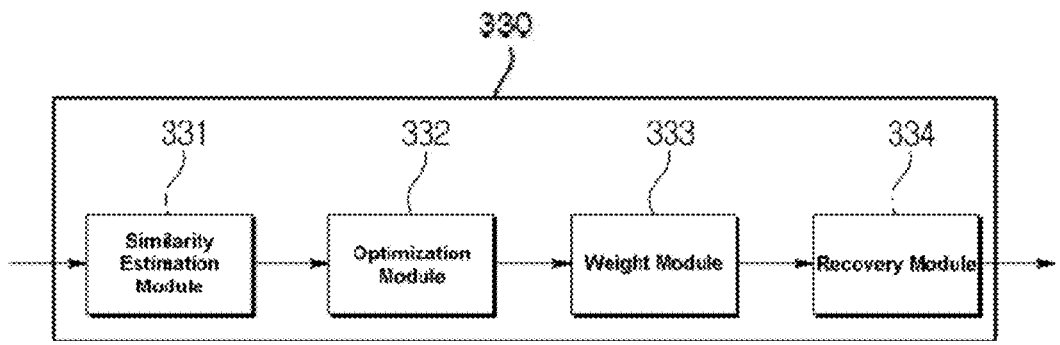
FIG. 5 is a block diagram of a k-NN based recovery unit according to an exemplary embodiment.

The k-NN based recovery unit 330 and the MLRM based recovery unit 340 calculate a recovery value using the recovery models selected by the recovery model combination unit 320. The k-NN based recovery unit 330 calculates the recovery value using an average of k nearest neighbor data. FIG. 5 is a block diagram of the k-NN based recovery unit 330 according to an exemplary embodiment.

The k-NN based recovery unit 330 according to the exemplary embodiment may include a similarity estimation module 331 for calculating a similarity, an optimization module 332 for optimizing the number k of particles, a weight module 333 for calculating a weight for each particle, and a recovery module 334 for calculating a recovery value. When a plurality of recovery models is used, each of the recovery models may be set to a particle. The similarity estimation module 331 calculates a similarity to the signal group Xs based on the optimal recovery model selected by the recovery model combination unit 320. Then, the optimization module 332 optimizes the number k of particles which are to be used for recovery, using an optimization algorithm. The weight module 333 for calculating a weight for each particle calculates a weight for each particle based on the above-described similarity, and the recovery module 334 performs recovery using the k-NN algorithm based on the weighted k particles.

The MLRM based recovery unit 340 calculates a recovery value based on the recovery model selected by the recovery model combination unit 320. At this time, since an input for the recovery model is needed, the signal group U* may be used as the input for the recovery model. MLRM may represent a multiple linear regression model in which a dependent variable (e.g., recovery value according to the exemplary embodiment) is decided by a plurality of independent variables (e.g., recovery values decided by the recovery model selected by the recovery model combination unit 320 according to the exemplary embodiment). At this time, a weight for each of the independent variables may be set to decide the dependent variable.

The recovery values decided by the k-NN based recovery unit 330 and the MLRM based recovery unit 340 are transferred to the ensemble learning unit 350. The ensemble learning unit 350 extracts the optimal recovery value based on the recovery values decided by the k-NN based recovery unit 330 and the MLRM based recovery unit 340. Ensemble learning refers to using a plurality of learning algorithms in order to obtain better performance than when each of the learning algorithms is separately used. In the exemplary embodiment, a plurality of recovery models and recovery algorithms having different characteristics may be selected in order to raise the accuracy of the recovery value, and ensemble learning may be used to estimate the optimal recovery value based on the recovery values estimated through the plurality of recovery algorithms.

The ensemble learning unit 350 may use various algorithms in order to estimate the most correct recovery value based on the recovery values estimated by the k-NN based recovery unit 330 and the MLRM based recovery unit 340. The various algorithms may include, for example, a bagging method, which is based on majority decision without multiplying a weight by each recovery value, and a boosting method, which estimates a recovery value by adding weighted values wherein each of the weighted values is a value obtained by multiplying a value estimated by each estimation model by a weight.

Figure 6:
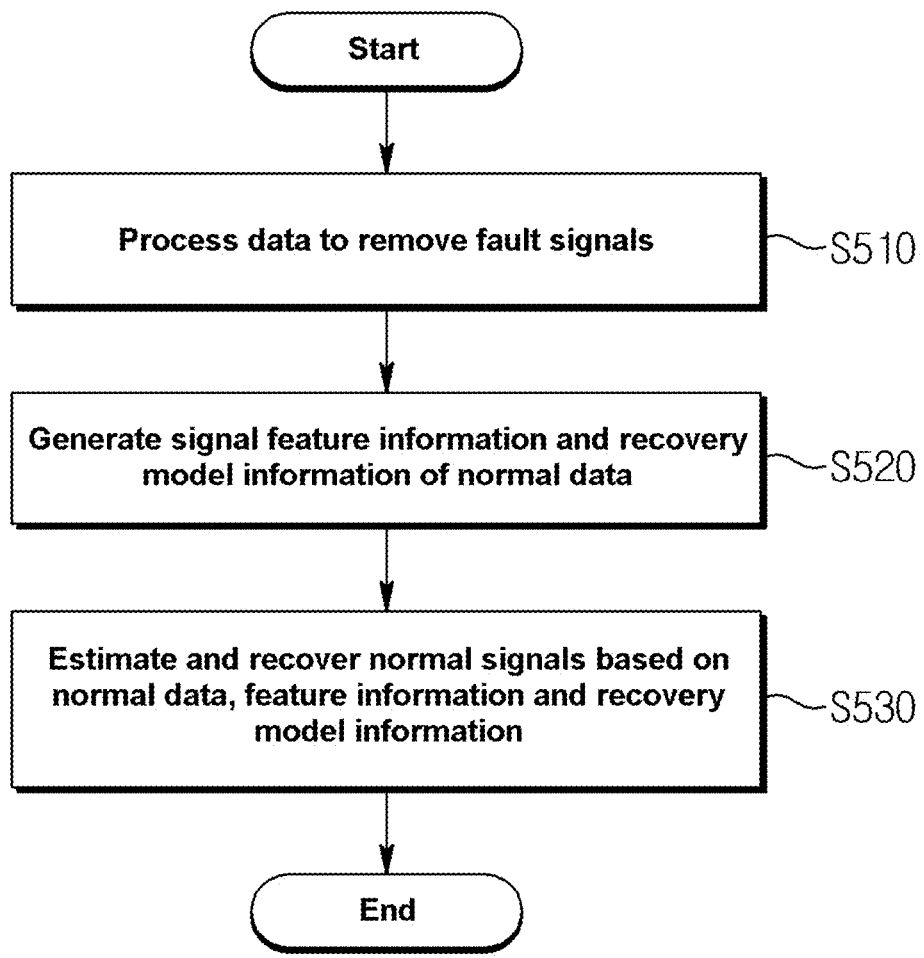
FIG. 6 is a flowchart illustrating a fault signal recovery method in the fault signal recovery apparatus according to an exemplary embodiment.

FIG. 6 is a flowchart illustrating a fault signal recovery method in the fault signal recovery apparatus according to an exemplary embodiment. Referring to FIG. 6, the fault signal recovery method in the fault signal recovery apparatus may begin with step S510 in which the data processing unit 100 processes input data to remove fault signals. At this time, three groups of data X, U, and S may be inputted to the fault signal recovery apparatus. The signal group X includes learning data used to create an existing fault prediction model and indicate a signal group which has normal values for a plurality of tags, and the input signal group U may indicate a signal group containing signals for the plurality of tags including a first group of tags having fault signals and a second group of tags having normal signals. That is, the input signal group U includes fault signals for the first group of tags, and the fault signal recovery apparatus may recover normal signals for the first group of tags contained in the input signal group U and use the normal signals as learning data. The input S includes information on the first group of tags which are to be recovered. Each of the signal group X and the signal group U may correspond to a matrix which contains values obtained in a time-ordered sequence for each tag. The rows of the matrix may indicate the types of signals (referred to as tags) which are measured through sensors or calculated through values acquired from sensors, and the columns of the matrix may indicate the values of the respective tags, which are acquired in a time-ordered sequence. The data processing unit 100 acquires from the input S information on tags containing fault signals, that is, the first group of tags to be recovered, and generates a signal group U* using the acquired information. The signal group U* may contain only signals corresponding to the second group of tags—i.e., excluding the data on the tags to be recovered from the input U. At this time, the signals contained in the signal group U* are normal signals. While the signal group U* is generated from the signal group U, the fault signals from the signal group U corresponding to the input S are removed.

In addition, the data processing unit 100 separates the signal group X into the signal group X* containing only signals corresponding to the second group of tags and the signal group Xs containing only signals corresponding to the first group of tags. At this time, the signals contained in the signal groups X* and Xs are all normal signals.

For example, the signal group X may correspond to a 15×2000 matrix which has 15 tags and 2,000 tag values for each of the tags, and the signal group U may correspond to a 15×1000 matrix which has 15 tags like the signal group X and 1,000 tag values for each of the tags. The input S may contain information on the first group of tags to be recovered. As shown in the exemplary embodiment of FIG. 2, the 10th, 14th and 15th tags may correspond to the tags to be recovered. Then, the signal group X* may be set to a 12×2000 matrix obtained by removing the 10th, 14th and 15th rows from the signal group X, and the signal group Xs may be set to a 3×2000 matrix composed of only the 10th, 14th and 15th rows of the signal group X. Furthermore, the signal group U* may be set to a 12×2000 matrix obtained by removing the 10th, 14th and 15th rows from the signal group U.

Based on the data generated by the data processing unit 100, the modeling unit 200 generates signal feature information and a plurality of recovery models at step S520. In order for the modeling unit 200 to generate the plurality of recovery models, the feature extraction unit 210 extracts a feature indicated by signals, based on the signal group X*. At this time, the feature extraction unit 210 may extract the feature using only one specific tag data, or extract the feature by combining signals for the whole tags contained in the signal group X*, or signals for some tags contained in the signal group X*. The extracted feature may indicate whether a power generator is started up or operated in a normal state, for example. Furthermore, the extracted feature may indicate in which season (e.g., spring, summer, fall and winter) data were collected or indicate a specific weather, for example. In addition, the feature extraction unit 210 may extract various features which can be obtained from data generated by the plant. The model creation unit 220 may generate a plurality of non-parametric models and parametric models, using the signal groups X* and Xs received from the data processing unit 100 based on the feature F extracted by the feature extraction unit 210.

Figure 7:
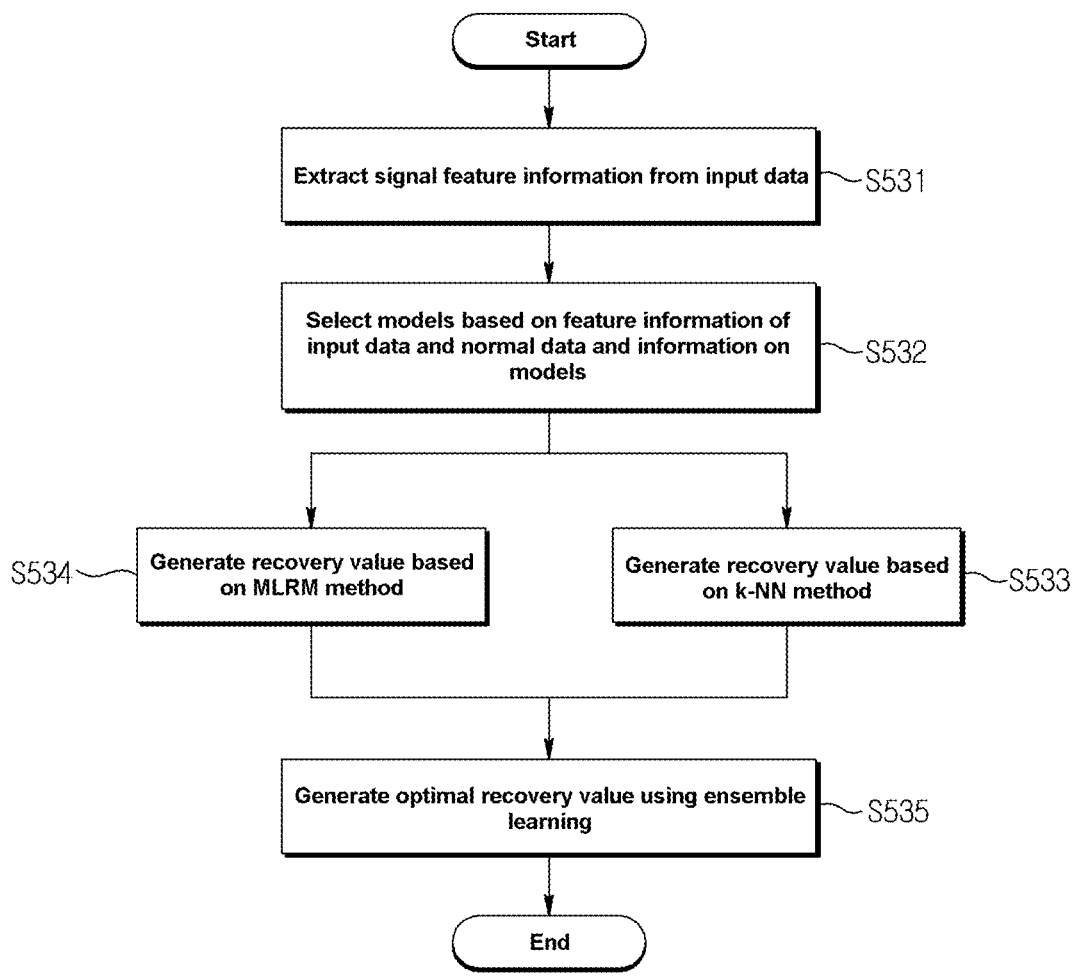
FIG. 7 is a flowchart illustrating a recovery step of the fault signal recovery method in the fault signal recovery apparatus according to an exemplary embodiment.

The recovery unit 300 estimates and recovers normal signals for the first group of tags based on the information received from the model creation unit 220 and the data processing unit 100, at step S530. FIG. 7 is a detailed flowchart illustrating a recovery step of the fault signal recovery method in the fault signal recovery apparatus according to an exemplary embodiment.

Referring to FIG. 7, the recovery step according to an exemplary embodiment will be described in more detail. The recovery model combination unit 320 of the recovery unit 300 extracts the feature information F* from the signal group U* in a similar manner to the feature extraction unit 210 of the modeling unit 200, at step S531. Then, the recovery model combination unit 320 finds a similar region by comparing the feature information F extracted by the feature extraction unit 210 of the modeling unit 200 to the feature information F* extracted by the feature extraction unit 310 of the recovery unit 300, and select recovery models which generate similar features in the similar region, as the optimal recovery model, at step S532. Then, the optimal recovery model may be used for fault signal recovery. The recovery model selected by the recovery model combination unit 320 may be used to generate a recovery value through a k-NN based method S533 and an MLRM based method S534.

The k-NN based method S533 calculates and generates the recovery value using an average of k nearest neighbor data. The k-NN based method may include a step of calculating a similarity, a step of optimizing the number k of particles, a step of calculating a weight for each particle, and a step of calculating a recovery value. At this time, when a plurality of non-parametric models are used, each of the non-parametric models may be set to a particle. The step of calculating a similarity may include calculating a similarity to the signal group Xs based on the optimal recovery model selected by the recovery model combination unit 320 and then optimizing the number k of particles to be used for recovery using the optimization algorithm. The step of calculating a weight for each particle may include calculating a weight for each particle based on the above-described similarity and calculating the recovery value based on the weighted k particles, using the k-NN algorithm.

The MLRM based method S534 calculates the recovery value based on the recovery model selected by the recovery model combination unit 320. At this time, since an input for the recovery model is needed, the signal group U* may be used as the input for the recovery model. MLRM may represent a multiple linear regression model in which a dependent variable (e.g., recovery value according to the exemplary embodiment) is decided by a plurality of independent variables (e.g., recovery values decided by the recovery model selected by the recovery model combination unit 320 according to the exemplary embodiment). At this time, a weight for each of the independent variables may be set to decide the dependent variable.

Finally, the optimal recovery value may be generated through ensemble learning based on the recovery values decided by the k-NN based method and the MLRM based method, at step S535. Ensemble learning refers to using a plurality of learning algorithm in order to obtain better performance than when each of the learning algorithms is separately used. In the exemplary embodiment, a plurality of recovery models and recovery algorithms having different characteristics may be selected in order to raise the accuracy of the recovery value, and ensemble learning may be used to estimate the optimal recovery value based on the recovery values estimated through the plurality of recovery models.

The fault signal recovery method according to the exemplary embodiment can significantly increase the recovery performance. In order to verify the performance of the exemplary embodiments according to the present disclosure, the performance of the fault signal recovery method according to the present disclosure, the performance of a signal recovery method using a VSG (Virtual Signal Generation) function mounted in a conventional system, and the performance of a k-NN based technique according to the related art have been compared through simulations.

<First Simulation>

The first simulation is based on the supposition that 15 sensor (tag) data were recovered in such a situation that 2nd, 14th, and 15th sensor data of the 15 sensor data were not acquired. Table 1 shows the result of the first simulation. The first simulation uses an accuracy and fault signal number as performance indicators. The accuracy indicates how accurately signals were recovered, and the fault signal number indicates the number of signals which were not accurately recovered. A reference value for determining whether the corresponding sensor data were accurately recovered was set by calculating 3% of the maximum value of the sensor data. When a predicted value of a signal recovered based on the reference value fell within the reference value of the actual value, the signal was determined to be accurately recovered.

Figure 8:
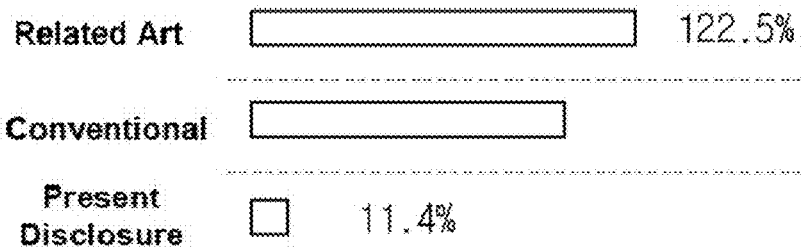
FIG. 8 illustrates a result of a simulation according to the present disclosure as compared with a conventional system.

FIG. 8 illustrates a result of the simulation which is based on the supposition that 15 sensor (tag) data are recovered in such a situation that the 2nd, 14th, and 15th sensor data among the 15 sensor (tag) data were not acquired.

TABLE 1

| | | Performance | |
| --- | --- | --- | --- |
| | Core technology | Accuracy | Fault signal number |
| Present Disclosure | Ensemble learning | 98.3% | 52 (11.4%) |
| Conventional | VBM | 84.7% | 458 (100%) |
| Related Art | k-NN | 81.3% | 561 (122.5%) |

Referring to FIG. 8 and Table 1, the signal recovery method of a conventional system exhibits an accuracy of 84.7% and the k-NN based method according to the related art exhibits an accuracy of 81.3%, but the fault signal recovery method according to the present disclosure exhibits an accuracy of 98.3%, which means that the fault signal recovery method according to the present disclosure exhibits the best performance. Furthermore, the number of signals which were incorrectly recovered was 458 for the signal recovery method of the conventional system and 561 for the k-NN based method according to the related art, but 52 for the fault signal recovery method according to the present disclosure, which means that the number of signals which were incorrectly recovered by the fault signal recovery method according to the present disclosure was 11.4% of that of the signal recovery method of the conventional system.

<Second Simulation>

The second simulation was performed to check how recovery performance changes with an increase in number of recovery sensors, while increasing the number of sensor data to be recovered one by one. When the number of signals to be recovered is increased, it may indicate that information data required for recovery are decreased. Thus, the recovery performance is inevitably degraded. In this situation, however, the recovery performance needs to be maximized in order to secure high-quality learning data.

Figure 9:
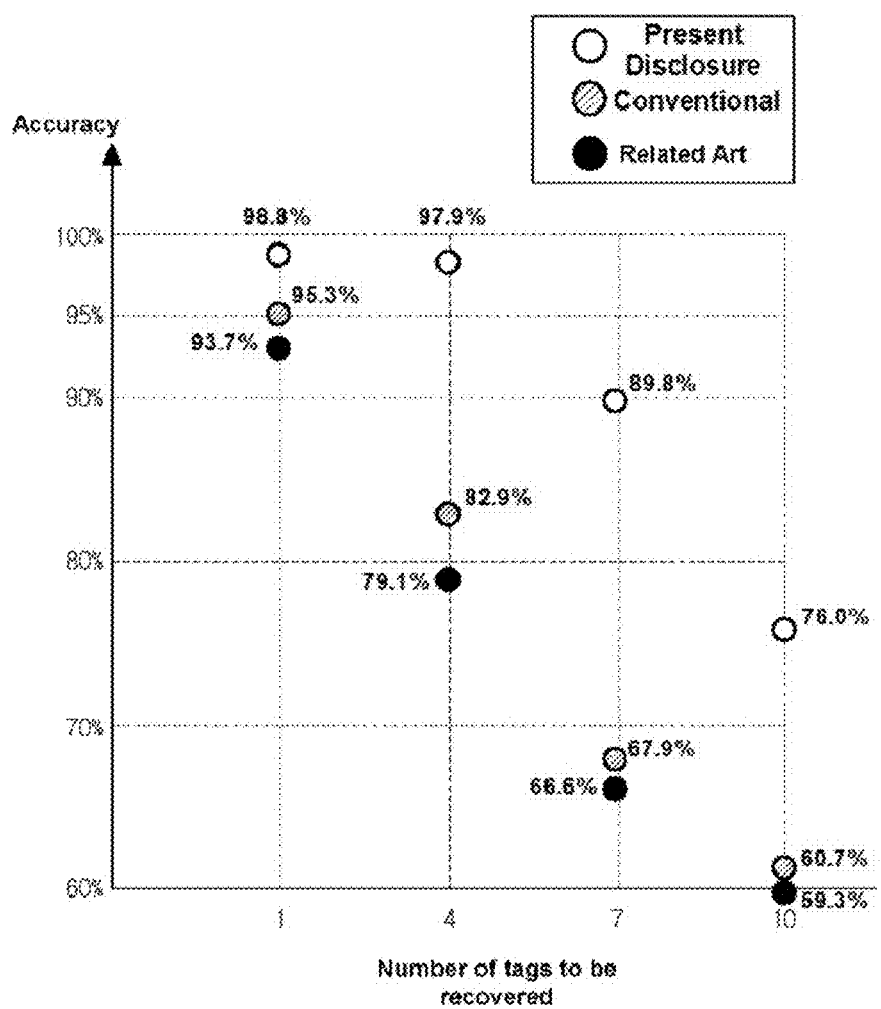
FIG. 9 is a graph illustrating the accuracies of signal recovery methods according to the present disclosure as compared with a conventional method.
Figure 10:
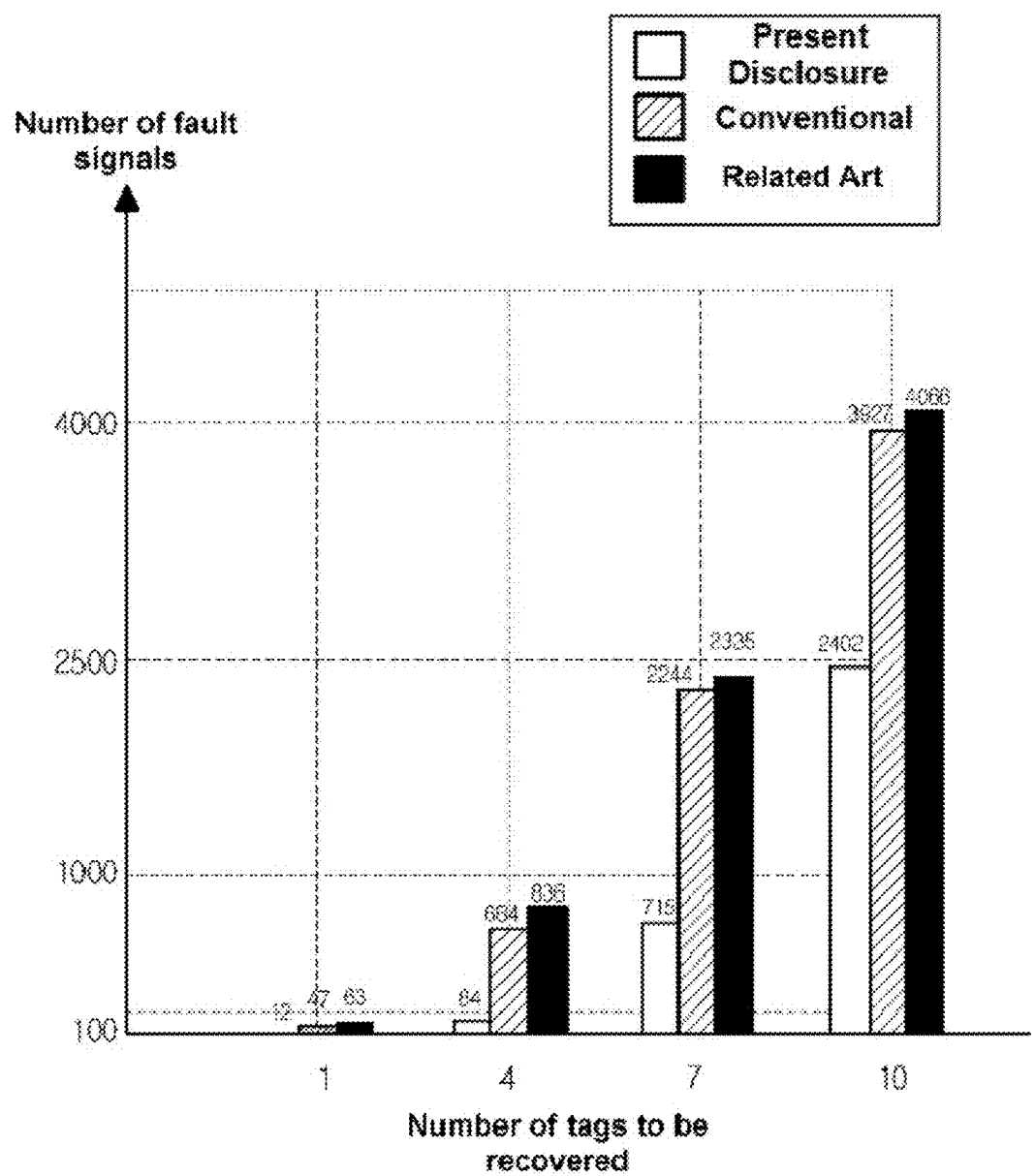
FIG. 10 is a graph illustrating the numbers of fault signals which remain as fault signals even after recovery according to the present disclosure as compared to a conventional system.

FIG. 9 is a graph illustrating the accuracies of the signal recovery methods when the number of signals (tags) to be recovered is increased to 1, 4, 7 and 10. FIG. 10 is a graph illustrating the numbers of fault signals which remain as fault signals even after recovery, when the number of signals (tags) to be recovered is increased to 1, 4, 7 and 10. Table 2 shows changes of the recovery performance when the number of signals (tags) to be recovered is increased to 1, 4, 7 and 10.

TABLE 2

|  |  | 1 | 4 | 7 | 10 |
|---|---|---|---|---|---|
| Accuracy | Present Disclosure | 98.8% | 97.9% | 89.9% | 76.0% |
|  | Conventional | 95.3% | 82.9% | 67.9% | 60.7% |
|  | Related Art | 93.7% | 79.1% | 66.6% | 59.3% |
| Fault signal number | Present Disclosure | 12 | 84 | 715 | 2402 |
|  | Conventional | 47 | 684 | 2244 | 3927 |
|  | Related Art | 63 | 836 | 2335 | 4066 |

Referring to FIG. 9 and Table 2, when the number of tags to be recovered was 1, the result of the fault signal recovery method according to the present disclosure and the result of the signal recovery method of the conventional system were 98.9% and 95.3%, respectively, which are not significantly different from each other. However, when the number of tags to be recovered was increased to four, the fault signal recovery method according to the present disclosure had an accuracy of 97.9% which is not significantly different from when the number of tags to be recovered was 1. On the other hand, the signal recovery method of the conventional system had an accuracy of 82.9% which means that the performance was considerably degraded. Furthermore, when the number of tags to be recovered was 7 and 10, the fault signal recovery method according to the present disclosure and the signal recovery method of the conventional system had an accuracy of 82.9%/76.0% and 67.9%/60.7%, respectively. This result shows that the increase in number of tags to be recovered inevitably degrades the performance because the number of pieces of information required for recovery is reduced. However, while the performance of the fault signal recovery method according to the present disclosure was not significantly reduced, the performance of the signal recovery method of the conventional system was significantly reduced.

Referring to FIG. 10 and Table 2, when the number of tags to be recovered was increased to 1→4→7→10, the number of fault signals which were not correctly recovered increased to 47→684→2244→3927 when the signal recovery method of is the conventional system was applied. However, when the fault signal recovery method according to the present disclosure was applied, the number of fault signals which were not correctly recovered increased to 12→84→715→2402, which means that the number of fault signals was much smaller than in the signal recovery method of the conventional system. In other words, the fault signal recovery method according to the present disclosure recovers signals with higher precision.

While the present disclosure has been described with respect to the specific exemplary embodiments, it will be apparent to those skilled in the art that various changes and modifications may be made without departing from the spirit and scope of the disclosure as defined in the following claims.

What is claimed is:

1. A fault signal recovery apparatus comprising:
   a plant comprising a plurality of sensors respectively generating a plurality of tags over time, each of the plurality of tags indicative of a signal value acquired through measuring a state of the plant, the plurality of sensors generating signal values over a period of time as a signal group X composed of normal signals for the plurality of tags and including sensors for respectively detecting a difference pressure of an inlet filter of a power generator, a turbine exhaust pressure of the power generator, and a turbine exhaust temperature of the power generator,
   wherein the signal group X includes learning data used to create an existing fault prediction model,
   wherein the plurality of sensors further generate a signal group U composed of signals for the plurality of tags including a first group of tags having fault signals and a second group of tags having normal signals,
   wherein the fault signals of the first group include a signal group S composed of signals indicative a fault in the plant and signals resulting from a sensor fault or network problem,
   the fault signal recovery apparatus further comprising:
      a data processing unit configured to generate
         a signal group U* from the signal group U by removing signals of the first group of tags from the signal group U, such that the signal group U* is composed of all the signals of the signal group U except for the signals of the signal group S,
         a signal group Xs from the signal group X, the signal group Xs composed of only the normal signals for the first group of tags, and
         a signal group X* from the signal group X, the signal group X* composed of only the normal signals for the second group of tags;
      a modeling unit configured to receive the signal group X* and the signal group Xs and to extract feature information F from the signal group X*, the modeling unit creating plural pieces of recovery model information P for fault signal recovery based on the extracted feature information F, the received the signal group X*, and the received signal group Xs; and
      a recovery unit configured to estimate and recover normal signals for the first group of tags based on the signal group U*, the signal group Xs, the feature information F, and the plural pieces of recovery model information P,
   wherein the feature information F is extracted from the signal group X* by a first feature extraction unit included in the modeling unit, the first feature extraction unit using at least one specific tag included in the normal signals for the second group of tags,
   wherein the recovery unit comprises:
      a second feature extraction unit configured to extract feature information F* from the signal group U*, wherein the second feature extraction unit is provided separately from the first feature extraction unit and is included in the recovery unit; and
      a recovery model selection unit configured to select recovery models to be used for fault signal recovery from among the plural pieces of recovery model information P based on a comparison result between the feature information F and the feature information F*, and
   wherein the extracted feature information F indicates whether the state of the power generator is started up, whether the power generator is operated in a normal state, and in which of four seasons data were collected by the plurality of sensors.

2. The fault signal recovery apparatus of claim 1, wherein the recovery unit further comprises:

a k-NN (k-Nearest Neighbor) based recovery unit configured to generate a first recovery signal value for the first group of tags through a k-NN method using the selected recovery models;

an MLRM (Multiple Linear Regression Model) based recovery unit configured to generate a second recovery signal value for the first group of tags through an MLRM method using the selected recovery models; and an ensemble learning unit configured to generate a final recovery signal value for the first group of tags through ensemble learning based on the first and second recovery signal values.

3. The fault signal recovery apparatus of claim 2, wherein the k-NN based recovery unit comprises:

a similarity estimation module configured to calculate similarities between the signal group Xs and estimation results of the selected recovery models;

an optimization module configured to optimize a parameter k of the k-NN method;

a weight module configured to calculate weights for the selected recovery models; and a recovery module configured to calculate a recovery value based on the parameter k, the weights, and the estimation results, of the selected recovery models.

4. The fault signal recovery apparatus of claim 2, wherein the MLRM based recovery unit generates the second recovery signal value for the first group of tags by adding weighted estimation results, each of the weighted estimation results being a value obtained by multiplying an estimation result of a respective recovery model of the selected recovery models by a corresponding weight for the respective recovery model.

5. The fault signal recovery apparatus of claim 1, wherein the first and second feature extraction units extract a feature using the same method.

6. A fault signal recovery method comprising:

generating a plurality of tags over time, each of the plurality of tags indicative of a signal value acquired through measuring a state of a plant comprising a plurality of sensors generating signal values over a period of time as a signal group X composed of normal signals for the plurality of tags and including sensors for respectively detecting a difference pressure of an inlet filter of a power generator, a turbine exhaust pressure of the power generator, and a turbine exhaust temperature of the power generator, wherein the signal group X includes learning data used to create an existing fault prediction model, wherein the plurality of sensors further generate a signal group U composed of signals for the plurality of tags including a first group of tags having fault signals and a second group of tags having normal signals, wherein the fault signals of the first group include a signal group S composed of signals indicative a fault in the plant and signals resulting from a sensor fault or network problem, the fault signal recovery method further comprising:

a data processing step of generating a signal group U* from the signal group U by removing signals of the first group of tags from the signal group U, such that the signal group U* is composed of all the signals of the signal group U except for the signals of the signal group S, a signal group Xs from the signal group X, the signal group Xs composed of only the normal signals for the first group of tags, and a signal group X* from the signal group X, the signal group X* composed of only the normal signals for the second group of tags;

a recovery model creation step of receiving the signal group X* and the signal group Xs and extracting feature information F from the signal group X*, the recovery model creation step creating plural pieces of recovery model information P for fault signal recovery based on the extracted feature information F, the received signal group X*, and the received signal group Xs; and a recovery step of estimating and recovering normal signals for the first group of tags based on the signal group U*, the signal group Xs, the feature information F and the plural pieces of recovery model information P, wherein the feature information F is extracted from the signal group X* by a first feature extraction step included in the recovery model creation step, the first feature extraction step using at least one specific tag included in the normal signals for the second group of tags, wherein the recovery step comprises:

a second feature extraction step of extracting feature information F* from the signal group U*, wherein the second feature extraction step is provided separately from the first feature extraction unit and is included in the recovery step; and a recovery model selection step of selecting recovery models to be used for fault signal recovery from among the plural pieces of recovery model information P based on a comparison result between the feature information F and the feature information F*, and wherein the extracted feature information F indicates whether the state of the power generator is started up, whether the power generator is operated in a normal state, and in which of four seasons data were collected by the plurality of sensors.

7. The fault signal recovery method of claim 6, wherein the recovery step further comprises:

a k-NN method based recovery step of generating a first recovery value for the first group of tags based on a k-NN method using the selected recovery models;

an MLRM method based recovery step of generating a second recovery value for the first group of tags based on an MLRM method using the selected recovery models; and a recovery value generation step of generating a recovery value for the first group of tags through ensemble learning based on the first and second recovery values.

8. The fault signal recovery method of claim 7, wherein the k-NN method based recovery step comprises:

a similarity estimation step of calculating similarities between the signal group Xs and estimation results of the selected recovery models;

an optimization step of optimizing a parameter k of the k-NN method;

a weight calculation step of calculating weights for the selected recovery models; and a recovery value calculation step of calculating a recovery value based on the parameter k, weights and the estimation results of the selected recovery models.

9. The fault signal recovery method of claim 7, wherein the MLRM method based recovery step comprises generating the second recovery signal value for the first group of tags by adding weighted estimation results, each of the weighted estimation results being a value obtained by multiplying an estimation result of a respective recovery model of the selected recovery models by a corresponding weight for the respective model.

10. The fault signal recovery method of claim 6, wherein the first and second feature extraction steps use the same method to extract a feature.

* * * * *